United States Patent [19]

Shiramizu

[11] Patent Number: 5,509,970
[45] Date of Patent: Apr. 23, 1996

[54] METHOD OF CLEANING SEMICONDUCTOR SUBSTRATE USING AN AQUEOUS ACID SOLUTION

[75] Inventor: Yoshimi Shiramizu, Tokyo, Japan

[73] Assignee: NEC Corporation, Tokyo, Japan

[21] Appl. No.: 308,302

[22] Filed: Sep. 19, 1994

[30] Foreign Application Priority Data

Sep. 21, 1993 [JP] Japan ................. 5-234600

[51] Int. Cl.$^6$ ............... C23G 1/02; C23G 1/14
[52] U.S. Cl. .................. 134/3; 134/2; 134/41
[58] Field of Search ............... 134/2, 3, 26, 28, 134/29, 41

[56] References Cited

U.S. PATENT DOCUMENTS

| | | | |
|---|---|---|---|
| 4,264,374 | 4/1981 | Beyer | 134/3 |
| 4,778,532 | 10/1988 | McConnell et al. | 134/10 |
| 5,129,955 | 7/1992 | Tanaka | 134/2 |
| 5,221,423 | 6/1993 | Sugino | 156/643 |
| 5,290,361 | 3/1994 | Hayashida et al. | 134/2 |
| 5,308,400 | 5/1994 | Chen | 134/2 |

OTHER PUBLICATIONS

T. Shimono et al., IEICE Trans. Electron. vol. E75–C No. 7, pp. 812–815.

*Primary Examiner*—Jan H. Silbaugh
*Assistant Examiner*—Saeed Chaudhry
*Attorney, Agent, or Firm*—Popham, Haik, Schnobrich & Kaufman, Ltd.

[57] ABSTRACT

Cleaning methods for semiconductor substrates which can remove metallic impurities and natural oxide films from the surface of the substrate. As a cleaning solution, aqueous acid solution containing 0.0001–0.001 weight % of ammonia based on a conversion off the amount off ammonium hydroxide or 0.0005–0.01 weight % of EDTA is used. The cleaning solution preferably contains 1–10 weight % of hydrogen fluoride. Metallic impurities removed from the surface of the substrate into the cleaning solution form complexes or chelates with ammonia molecules or EDTA molecules, thereby masking the metallic impurities.

4 Claims, 3 Drawing Sheets

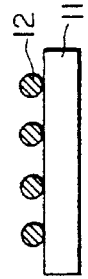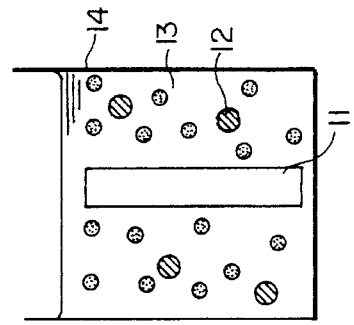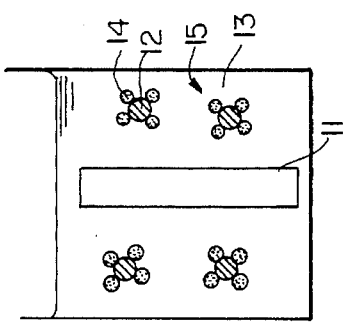
FIG. 4A   FIG. 4B   FIG. 4C   FIG. 4D
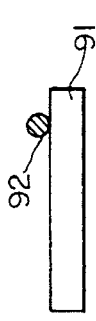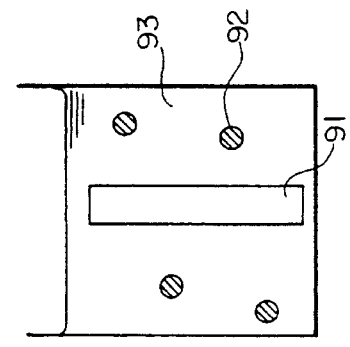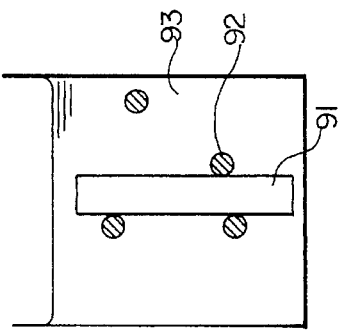
FIG. 2A (PRIOR ART)   FIG. 2B (PRIOR ART)   FIG. 2C (PRIOR ART)   FIG. 2D (PRIOR ART)
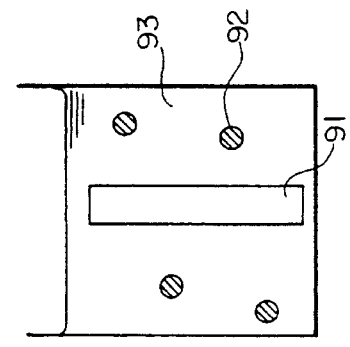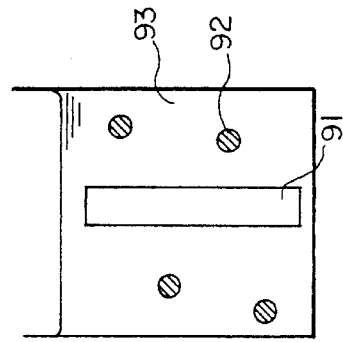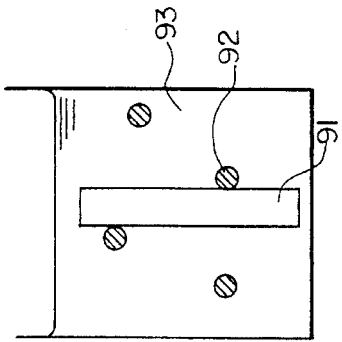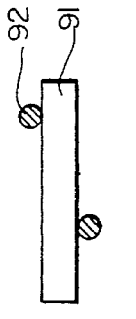
FIG. 1A (PRIOR ART)   FIG. 1B (PRIOR ART)   FIG. 1C (PRIOR ART)   FIG. 1D (PRIOR ART)

METHOD OF CLEANING SEMICONDUCTOR SUBSTRATE USING AN AQUEOUS ACID SOLUTION

BACKGROUND OF THE INVENTION

1. Field of the Invention

The present invention relates to a method of wet cleaning semiconductor substrates.

2. Description of the Related Art

It Is known in the fabrication of semiconductor devices that the yield of semiconductor devices is greatly affected by the process of wet cleaning semiconductor substrates. In wet cleaning a semiconductor substrate to remove metallic impurities from the substrate surface, it Is important to prevent the removed metallic impurities from adhesion again on the substrate surface and also to prevent traces of metallic impurities contained in the cleaning solution from adhering to the semiconductor substrate surface. If metallic impurities are left on the surface of the semiconductor substrate, the dielectric strength of the silicon oxide film is greatly lowered, and the pn junctions suffer from increased leak currents, resulting in deterioration in the characteristics of fabricated semiconductor devices. As the design rule of recent semiconductor devices becomes finer, metallic impurities remaining on semiconductor substrates have a greater adverse effect on the characteristics and yield of semiconductor devices.

One process of cleaning semiconductor substrates that has been known for a long time is the RCA cleaning process for removing particle impurities and the natural oxide film and metallic impurities from a semiconductor substrate surface. The RCA cleaning process has many modifications, one of which is disclosed in Japanese patent laid-open No. 2-2130 (JP, A, 2-2130). According to the disclosed RCA cleaning process, a semiconductor substrate is first cleaned with an ammonia-hydrogen peroxide cleaning solution composed of ammonia water (29%), hydrogen peroxide water (30%), and water (1 : 1 : 5), and then cleaned In a dilute hydrofluoric acid cleaning solution composed of dilute hydrofluoric acid (50%) and water (3 : 100) to remove a natural oxide film from the semiconductor substrate. Thereafter, the semiconductor substrate is boiled in a hydrochloric acid-hydrogen peroxide cleaning solution composed of hydrochloric acid (36%), hydrogen peroxide water (30%), and water (1 : 1 : 5). In the RCA cleaning process, the ammonia-hydrogen peroxide cleaning solution serves to promote a reaction to dissolve and remove silicon oxide film with ammonia, and also promote a reaction to form a silicon oxide film with hydrogen peroxide, thereby removing fine impurity particles through a combination of these competitive reactions. The dilute hydrofluoric acid cleaning solution dissolves and removes a natural oxide film on the surface of the semiconductor substrate, thus removing metallic impurities from the surface of the semiconductor substrate. When the semiconductor substrate is boiled in the hydrochloric acid-hydrogen peroxide cleaning solution, metallic impurities on the surface of the semiconductor substrate are turned into a soluble chloride which is dissolved and removed, with hydrogen peroxide serving as an oxidizing agent.

The conventional cleaning process described above has the following drawbacks:

While the ammonia-hydrogen peroxide cleaning solution is highly effective in removing fine particles from the substrate surface, since the cleaning solution is alkaline, even if the cleaning solution contains a very low concentration of metallic impurities, e.g., $10^{-12}$ g per 1 g of the cleaning solution, the cleaning solution allows such metallic impurities to adhere to the surface of the semiconductor substrate at a surface density ranging from $1\times10^{12}$ to $1\times10^{13}$ atoms/cm$^2$. Some of the metallic impurities thus deposited on the surface of the semiconductor substrate will not be removed even by the dilute hydrofluoric acid cleaning solution and the hydrochloric acid-hydrogen peroxide cleaning solution. Noble metal elements, typically copper, used as an interconnection material in semiconductor devices are liable to adhere to semiconductor substrate surfaces. When a natural oxide film on a surface of a semiconductor substrate is removed using a dilute hydrofluoric acid cleaning solution, such a noble metal element tends to adhere again to the semiconductor substrate. If the hydrochloric acid-hydrogen peroxide cleaning solution contains metallic impurities such as of iron and aluminum, then they are apt to remain as oxides in the natural oxide film formed on the semiconductor substrate. The hydrochloric acid-hydrogen peroxide cleaning solution is also problematic in that an unnecessary natural oxide film is formed at the same time metallic impurities are removed.

FIGS. 1A, 1B, 1C, and 1D schematically show a process by which a metallic impurity adheres to a semiconductor substrate surface when the dilute hydrofluoric acid cleaning solution is used. When a semiconductor substrate 91 whose surface has already been contaminated by metallic impurities 92 as shown in FIG. 1A is cleaned, the semiconductor substrate 91 is immersed into a cleaning solution 98, and the metallic impurities 92 are separated from the semiconductor substrate 91 into the cleaning solution 98 as shown in FIG. 1B. However, since a natural oxide film has been removed from the surface of the semiconductor substrate 91, some kinds of metallic impurities 92 In the cleaning solution 93 again adhere to the surface of the semiconductor substrate 91 as shown in FIG. 1C. As a consequence, as shown in FIG. 1D, metallic impurities 92 remain on the surface of the semiconductor substrate 91.

FIGS. 2A, 28, 2C, and 2D schematically show a process by which a metallic impurity adheres to a semiconductor substrate surface when a cleaning solution containing metallic impurities is used. As shown in FIG. 2A, only a trace of metallic impurity 92 remains on the surface of a semiconductor substrate 91. When the semiconductor substrate 91 is immersed in a cleaning solution 93 Which contains metallic impurities 92, as shown in FIG. 2B, the metallic impurities 92 are removed from the surface of the semiconductor substrate 91. However, as shown in FIG. 2C, metallic impurities 92 are transferred from the cleaning solution 93 and adhere to the semiconductor substrate 91. As a result, as shown in FIG. 2D, more metallic impurities 92 are present on the cleaned semiconductor substrate 91 than before the semiconductor substrate 91 is cleaned.

In IEICE Trans. Electron, Vol. E75-C, No. 7, pp. 812–818, July 1992, Tsugio Shimono and Mikio Tsuji report a cleaning solution composed of hydrofluoric acid, hydrogen peroxide, and water as a cleaning solution which is suitable for removing metallic impurities from a silicon wafer and which can also be used as an etchant. It is indicated that when a silicon wafer surface is cleaned by the reported cleaning solution, the surface density of metallic impurities on the cleaned silicon wafer is smaller than when cleaned by the conventional cleaning solution described above.

SUMMARY OF THE INVENTION

It is therefore an object of the present invention to provide a method of cleaning a semiconductor substrate with a cleaning solution while preventing metallic impurities in a cleaning solution from adhering to the surface of the semiconductor substrate and while also preventing metallic impurities that have been removed from the surface of the semiconductor substrate from again adhering to the surface of the semiconductor substrate, thereby reliably removing metallic impurities from the surface of the semiconductor substrate and suppressing undesirable formation of a natural oxide film on the surface of the semiconductor substrate.

The above object can be achieved by a method of cleaning a semiconductor substrate comprising a step of immersing a semiconductor substrate in a cleaning solution which comprises an aqueous acid solution containing a component which can be coordinated with metal atoms to be removed from the semiconductor substrate.

The above object can also be achieved by a method of cleaning a semiconductor substrate comprising a step of immersing a semiconductor substrate in a cleaning solution which comprises an aqueous acid solution containing 0.0001–0.001 weight % of ammonia, based on a conversion of the amount of ammonium hydroxide.

The above object can also be achieved by a method of cleaning a semiconductor substrate comprising a step of immersing a semiconductor substrate in a cleaning solution which comprises an aqueous acid solution containing 0.0005–0.01 weight % of ethylenediaminetetraacetic acid.

The cleaning methods according to the present invention employ a cleaning solution which comprises an aqueous acid solution containing a small amount of ligand component, for example 0.0001–0.01 weight %. When a semiconductor substrate is immersed in the cleaning solution, a metallic impurity on the semiconductor substrate is easily separated therefrom into the cleaning solution where it forms a complex or chelate in the cleaning solution. The metallic impurity is thus masked by the formation of the complex or chelate, and prevented from again adhering to the semiconductor substrate. Metal impurities which lave already been contained in the cleaning solution are present as a complex, and are also prevented from adhering to the semiconductor substrate in the cleaning solution. The cleaning method according to the present invention is particularly suitable for the cleaning of a silicon substrate.

Since the cleaning method according to the present invention also aims at the removal of a natural oxide film from a semiconductor substrate, it is preferable that the cleaning solution contain 1–10 weight % of hydrogen fluoride such that the cleaning solution has a pH of 1. The pH of 1 is entirely different from the pH value of a conventional cleaning solution of ammonium fluoride. Unlike a conventional ammonium fluoride cleaning solution, the cleaning solution according to the present invention removes metallic impurities while removing a natural oxide film and can achieve highly efficient removal of metallic impurities.

The ligand component should preferably be ammonia or ethylenediaminetetraacetic acrid (EDTA). If ammonia is used, its concentration ranges from 0.0001 to 0.001 weight %, and if EDTA is used, its concentration ranges from 0.0005 to 0.01 weight %.

The reasons for the above concentration ranges for ammonia and EDTA will be described below.

First, regarding the concentration range of ammonia, it is assumed that the concentration of metallic impurities on the surface of a semiconductor wafer before it is cleaned ranges from $5 \times 10^{11}$ to $5 \times 10^{12}$ atoms/cm$^2$ per metallic element, that 25 silicon wafers each 15 cm across are to be cleaned in 5 liters of a cleaning solution, and that the circle ratio is represented by $\pi$ and the Avogadro's number by N ($=6.02 \times 10^{23}$/mol). Since the total surface area of the silicon wafers is $7.5 \times 7.5 \times 2 \times \pi$ cm$^2$, insofar as all metallic impurities on the wafer surface are transferred into the cleaning solution, the concentration of metallic impurities in the cleaning solution will range from $1.5 \times 10^{-9}$ to $1.5 \times 10^{-8}$ mol/l per element. If there are six elements of such metallic impurities, then when ammonia and a metal form a complex, since four or six ammonia molecules are generally coordinated with one metal atom, the concentration of ammonia which corresponds stoichiometrically to all the metallic impurities is $5.4 \times 10^{-7}$ mol/l for a maximum case, i.e., when the surface density of metallic impurities per element is $5 \times 10^{12}$ atoms/cm$^2$ and the coordination number is 6. The concentration of ammonia is $3.6 \times 10^{-8}$ mol/l for a minimum case.

If ammonia five times the equivalent is required in order to fully mask metallic impurities by the formation of a complex, then the concentration of ammonia is $2.7 \times 10^{-6}$ mol/l for a maximum case and $1.8 \times 10^{-7}$ mol/l for a minimum case. These concentrations, when converted to ammonium hydroxide (NH$_4$OH: molecular weight 35.05) and expressed by weight concentrations, are about 0.001 weight % and about 0.0001 weight %, respectively.

FIG. 3 is a graph showing the amount of impurities remaining on a wafer surface after immersing a silicon wafer in acid solutions containing various concentrations of ammonia in an aqueous solution of nitric acid. The acid solutions have a constant pH value. It can be seen from FIG. 3 that as the ammonia concentration increases, the remaining amount of metallic impurities decreases, but the amount of ammonia left on the wafer surface increases. If an aqueous solution of hydrofluoric acid is used, then as the ammonia concentration increases, the pH value increases, and the ability of the cleaning solution to dissolve metal elements is lowered, resulting in a reduction in the cleaning capability. Any residue of ammonia on the surface of the semiconductor substrate must be minimized because it harms the resolution of a chemical-sensitized resist. From the above considerations, it can be understood that the concentration of ammonia in the cleaning solution should be 0.001 weight % or less, based on a conversion of the amount ammonium hydroxide.

Regarding the concentration range of EDTA, the molecular weight of EDTA is 292.25, and one molecule of EDTA generally coordinates with one metal atom. If EDTA five times the equivalent is required, as with ammonia, then the concentration of EDTA is 0.0013 weight % For a maximum case and 0.00013 weight % for a minimum case. In view of the fact that EDTA has a small dissociation constant, the concentration of EDTA ranges from 0.0005 weight % to 0.01 weight % according to the present invention.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1A, 1B, 1C and 1D are schematic views illustrative of a process by which a metallic impurity is deposited on a semiconductor substrate surface when a dilute hydrofluoric acid cleaning solution is used;

FIGS. 2A, 2B, 2C and 2D are schematic views illustrative of a process by which a metallic impurity is deposited on a semiconductor substrate surface when a cleaning solution containing metallic impurities is used;

FIGS. 4A, 4B, 4C and 4D are schematic views showing a cleaning process according to Example 1;

DETAILED DESCRIPTION OF THE PREFERRED EMBODIMENTS

Example 1

Figure 3:
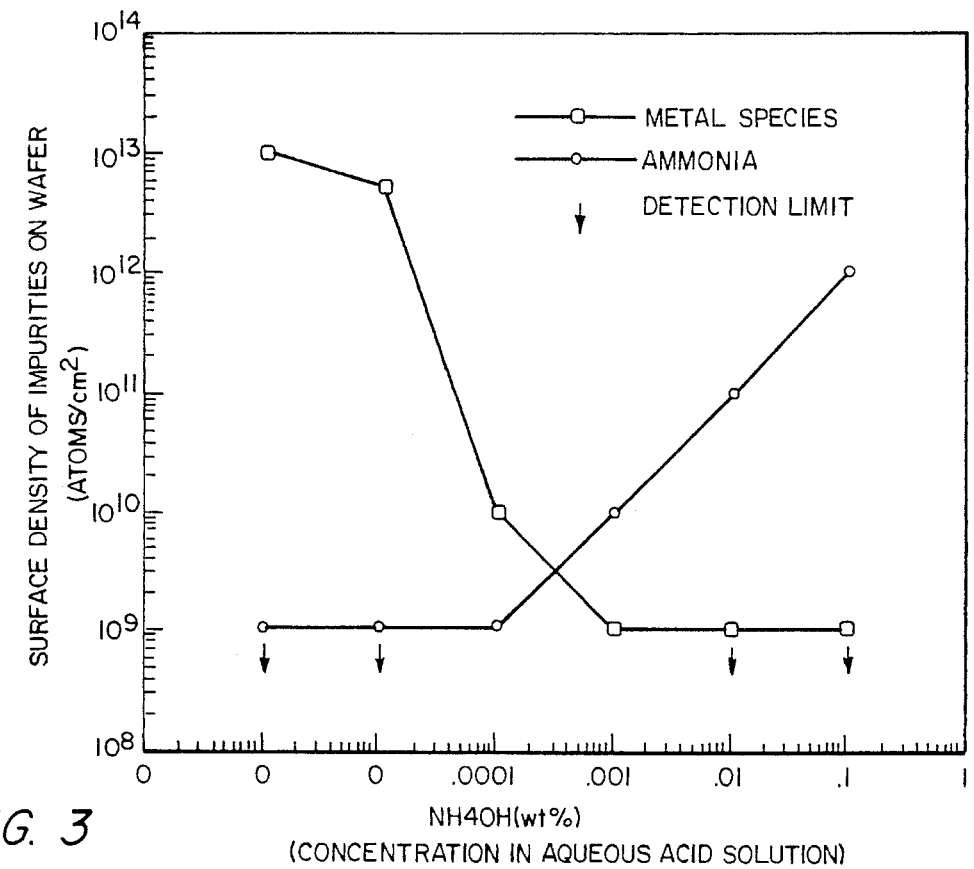
FIG. 3 is a graph showing the relationship between the concentration of ammonia and the amount of impurities on a wafer surface.

In this example, a semiconductor substrate with a metallic impurity intentionally deposited on its surface was cleaned.

An aqueous solution of nitric acid containing about 500 µg of iron (Fe) per liter and about 500 µg of copper (Cu) per liter was prepared and dropped onto a clean silicon semiconductor substrate 11 (see FIGS. 4A through 4D). The semiconductor substrate 11 was then left for several tens of seconds, following which the droplets on the surface of the semiconductor substrate 11 were removed by a centrifugal process. The semiconductor substrate 11 was then dried, In this manner, the semiconductor substrate 11 with metallic impurities 12 present on its surface was prepared as shown in FIG. 4A.

A cleaning solution 13 (see FIG, 4B) containing 1–10 weight % of dilute hydrofluoric acid and 0.0001–0.001 weight % of ammonia ($NH_3$) based on a conversion of the amount of ammonia hydroxide was prepared, and the semiconductor substrate 11 was cleaned by immersion in the cleaning solution 13. As a result, a natural oxide film was removed from the surface of the silicon semiconductor substrate 11, and at the same time the metallic impurities 12 were removed from the surface of the semiconductor substrate 11, as shown in FIG. 4B. The metallic impurities 12 that were transferred from the semiconductor substrate 11 into the cleaning solution 13 then produced metal complexes 15 with ammonia molecules 14, as shown in FIG. 4C. The number of ammonia molecules 14 coordinated with one metal atom of metallic impurities 12 normally ranges from 4 to 6 depending on the kind of the metallic impurities 12. Since the metal complexes 15 were formed, no metallic impurities 12 again adhered to the surface of the semiconductor substrate 11. Therefore, as shown in FIG. 4D, the surface of the semiconductor substrate 11 removed from the cleaning solution 13 was free from contamination by metallic impurities.

Comparative Example

A silicon semiconductor substrate was cleaned in the same manner as Example 1 except that a conventional cleaning solution composed of 1–10 weight % of dilute hydrofluoric acid was used. When immersed in the cleaning solution, a natural oxide film and metallic impurities were removed from the surface of the semiconductor substrate. However, since the metallic impurities transferred into the cleaning solution were not masked by the formation of metal complexes, the metallic impurities again adhered to the surface of the silicon substrate. In particular, a large number of atoms of a metal element such as copper, which has a smaller ionization tendency than silicon, again adhered to the surface of the silicon substrate.

Figure 5:
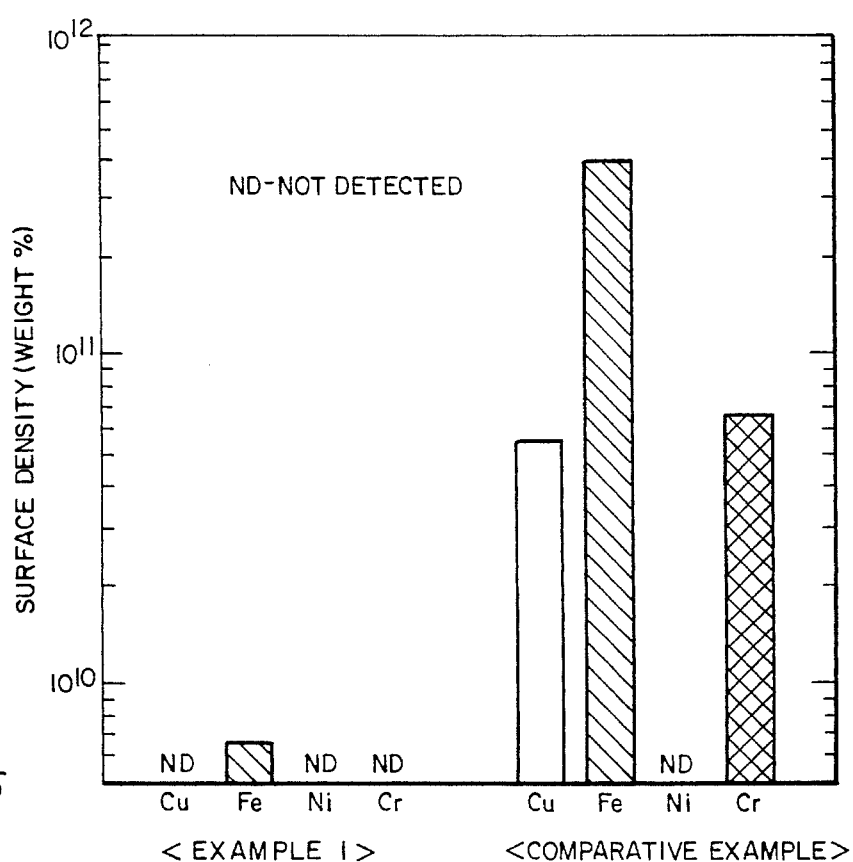
FIG. 5 is a graph showing the concentrations of various metallic impurities remaining on the surfaces of semiconductor substrates in Example 1 and a Comparative Example.

FIG. 5 shows the concentrations of various metallic impurities remaining on the surfaces of semiconductor substrates in Example 1 and the Comparative Example. In Example 1, hydrofluoric acid vapor phase decomposition (VPD)-atomic absorption spectrometry (AAS) is used to analyze on a substrate surface metallic impurities. The concentrations were determined by dissolving the metal elements with a hydrofluoric acid vapor and measuring the dissolved metal elements by atomic absorption spectrometry. The graph shown in FIG. 5 indicates that almost no metallic impurities were left on the surface of the silicon semiconductor substrate cleaned with the cleaning solution according to Example 1, but a considerable amount of metallic impurities remained on the surface of the silicon substrate cleaned with the cleaning solution according to the Comparative Example. The results shown in FIG. 5 prove the effectiveness of the cleaning process according to the present invention.

Example 2

The principles of the present invention are also effective when a trace of metallic impurities is mixed into the cleaning solution itself.

Figure 6A:
FIGS. 6A, 6B, 6C, and 6D are schematic views showing a cleaning process according to Example 2.
Figure 6B:
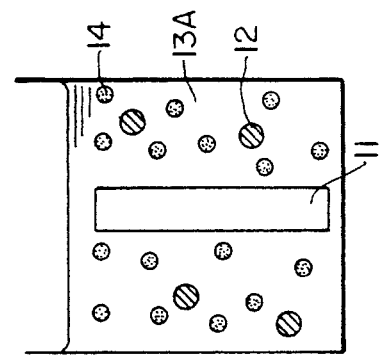
Figure 6C:
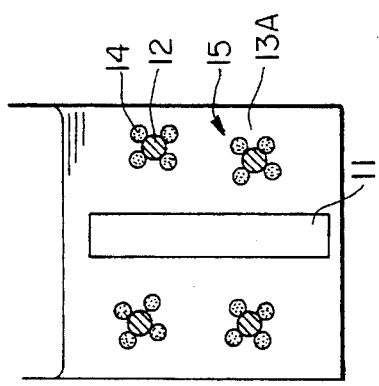
Figure 6D:

Unlike Example 1, a silicon semiconductor substrate 11 was not intentionally contaminated by a metal element. As shown in FIG. 6A, only a trace of metallic impurities 12 was present on the surface of the semiconductor substrate 11. A cleaning solution 13A was prepared having the same composition as the cleaning solution 13 in Example 1 except that it contained a trace of metallic impurities 12, and the semiconductor substrate 11 was immersed in the cleaning solution 13A. The metallic impurities 12 were removed from the surface of the semiconductor substrate 11, as shown in FIG. 6B. The metallic impurities 12 in the cleaning solution 13 then produced metal complexes 15 with ammonia molecules 14, as shown in FIG. 6C. Since the metal complexes 15 were formed, no metallic impurities adhered to the surface of the semiconductor substrate 11. Therefore, as shown in FIG. 6D, the surface of the semiconductor substrate 11 removed from the cleaning solution 13 was free from contamination by metallic impurities.

Example 3

A cleaning solution 13B containing 1–10 weight % of dilute hydrofluoric acid and 0.0005–0.01 weight % of ethylenediaminetetraacetic acid (EDTA) was prepared.

Figure 7A:
FIGS. 7A, 7B, 7C and 7D are schematic views showing a cleaning process according to Example 3.
Figure 7B:
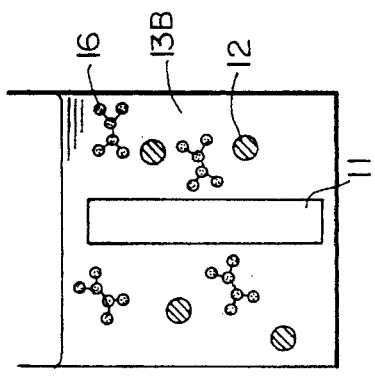
Figure 7C:
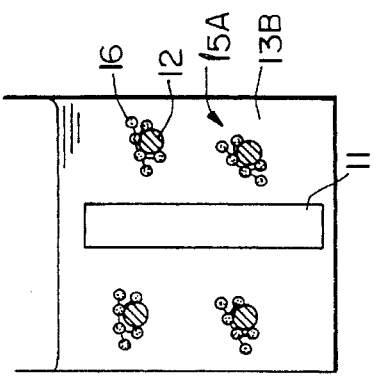
Figure 7D:

As with Example 1, a silicon semiconductor substrate 11 with metal molecules 12 present thereon was prepared as shown in FIG. 7A and immersed into the cleaning solution 13 as shown In FIG. 7B. As a result, a natural oxide film was removed from the surface of the semiconductor substrate 11, and at the same time the metallic impurities 12 were removed from the surface of the semiconductor substrate 11, as shown in FIG. 7B. The metallic impurities 12 were transferred from the semiconductor substrate 11 into the cleaning solution 13B, and immediately produced chelates 15A with EDTA molecules 16 as shown in FIG. 7C. Since the metal molecules 12 were masked as chelates 15A, no metallic impurities 12 again adhered to the surface of the semiconductor substrate 11. Therefore, as shown in FIG. 7D, the surface of the silicon semiconductor substrate 11 removed from the cleaning solution 13B was free from contamination by metallic impurities.

Although certain preferred embodiments of the present invention have been shown and described in detail, it should be understood that various changes and modifications may be made therein without departing from the scope of the appended claims.

What is claimed is:

1. A method of cleaning a semiconductor substrate, comprising the steps of:

providing a cleaning solution containing an aqueous acid solution containing 0.0001–0.001 weight % of ammonia based on a conversion of an amount of ammonium hydroxide and 1–10 weight % of hydrogen fluoride; and immersing a semiconductor substrate in said cleaning solution.

2. The method according to claim 1, wherein said semiconductor substrate comprises a silicon.

3. A method of cleaning a semiconductor substrate, comprising the steps of:

providing a cleaning solution containing an aqueous acid solution containing 0.0005–0.01 weight % of ethylenediaminetetraacetic acid and 1–10 weight % of hydrogen fluoride; and immersing a semiconductor substrate in said cleaning solution.

4. The method according to claim 3, wherein said semiconductor substrate comprises a silicon.

* * * * *